United States Patent [19]
Yamazaki

[11] Patent Number: 5,270,029
[45] Date of Patent: * Dec. 14, 1993

[54] CARBON SUBSTANCE AND ITS MANUFACTURING METHOD

[75] Inventor: Shunpei Yamazaki, Tokyo, Japan

[73] Assignee: Semiconductor Energy Laboratory Co., Ltd., Kanagawa, Japan

[*] Notice: The portion of the term of this patent subsequent to Sep. 26, 2006 has been disclaimed.

[21] Appl. No.: 790,068

[22] Filed: Nov. 12, 1991

Related U.S. Application Data

[63] Continuation of Ser. No. 463,787, Jan. 10, 1990, abandoned, which is a continuation of Ser. No. 159,857, Feb. 24, 1988, abandoned.

[30] Foreign Application Priority Data

Feb. 24, 1987 [JP] Japan .................................. 62-41748
Jul. 13, 1987 [JP] Japan ................................. 62-175560

[51] Int. Cl.$^5$ ............................................. B05D 5/12
[52] U.S. Cl. .................. 423/449.1; 423/446; 427/450; 427/577; 204/173; 156/610; 156/DIG. 68
[58] Field of Search ............... 423/446, 449.1; 437/38, 437/39, 113, 255.2, 450, 577; 256/610, DIG. 68; 501/86; 264/173

[56] References Cited

U.S. PATENT DOCUMENTS

| | | | |
|---|---|---|---|
| 3,630,677 | 12/1971 | Angus | 423/446 |
| 3,961,103 | 6/1976 | Risenberg | 427/39 |
| 4,434,188 | 2/1984 | Kamo et al. | 204/173 |
| 4,504,519 | 3/1985 | Zelez | 204/173 |
| 4,569,738 | 2/1986 | Kieser et al. | 204/173 |
| 4,816,286 | 3/1989 | Hirose | 427/39 |

FOREIGN PATENT DOCUMENTS

| | | | |
|---|---|---|---|
| 58-110494 | 7/1983 | Japan | 423/446 |
| 59-63732 | 4/1984 | Japan | 423/446 |
| 60-191097 | 9/1985 | Japan | 423/446 |
| 60-195094 | 12/1985 | Japan | 423/446 |
| 61-36200 | 2/1986 | Japan | 423/446 |
| 62-171993 | 2/1987 | Japan | 423/446 |

OTHER PUBLICATIONS

Marwec et al., "Electron Spectroscopy of Ion Beam and Hydrocarbon Plasma Generated Diamond Like Carbon Films", J. Vac. Sci. Technol. 18(2) Mar. 1981, pp. 226–228.

*Primary Examiner*—Robert Kunemund
*Attorney, Agent, or Firm*—Sixbey, Friedman, Leedom & Ferguson

[57] ABSTRACT

A carbon film consisting of diamond powder contains nitrogen and boron therein. In the light of the addition of nitrogen and boron, the diamond is fabricated without growing defects and the film make in sturdy mechanical contact with the underlying surface.

8 Claims, 9 Drawing Sheets

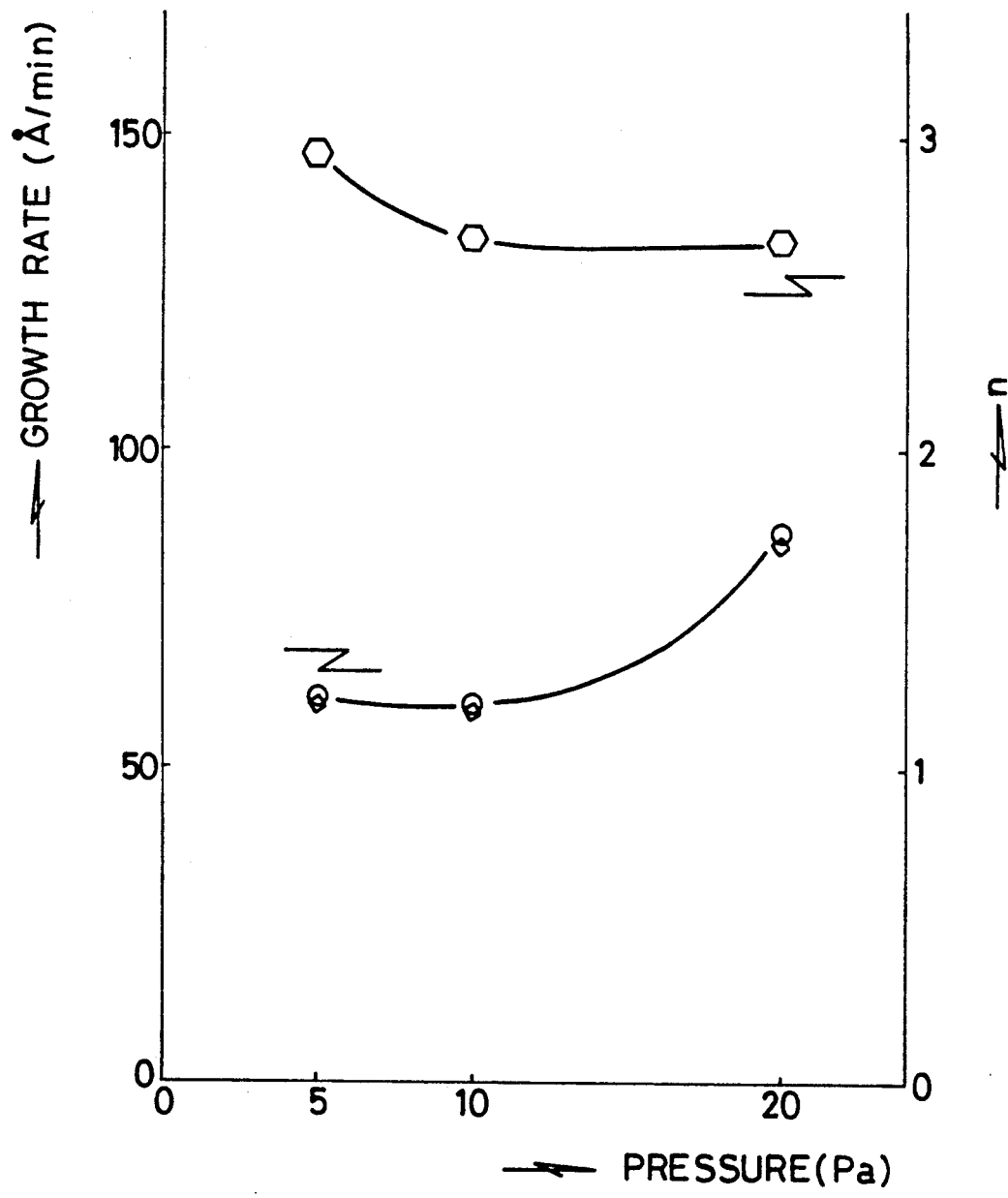

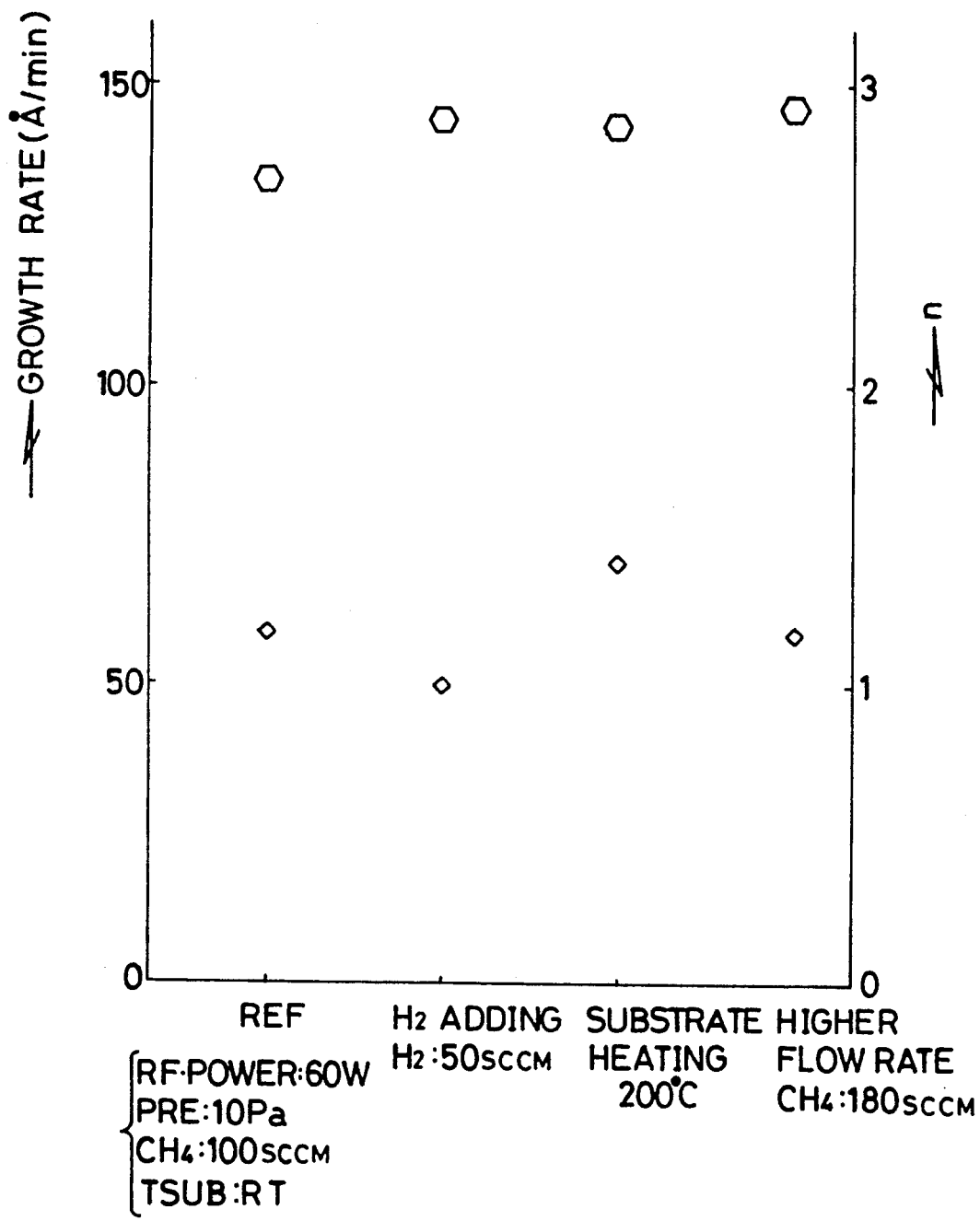

CARBON SUBSTANCE AND ITS MANUFACTURING METHOD

This application is a Continuation of Ser. No. 07/463,787, filed Jan. 10, 1990, now abandoned which is a Continuation of Ser. No. 07/159,857, filed Feb. 24, 1988, now abandoned.

BACKGROUND OF THE INVENTION

This invention relates to carbon substance and its manufacturing method.

Recently, ECR CVD has attracted the interests of researchers as a new method of manufacturing thin films, particularly amorphous thin films. For example, Matsuo et al discloses one type of such an ECR CVD apparatus in U.S. Pat. No. 4,401,054. This recent technique utilizes microwaves to energize a reactive gas into a plasma state by virtue of a magnetic field which functions to pinch the plasma gas within the excitation space. With this configuration, the reactive gas can absorb the energy of the microwaves. A substrate to be coated is located distant from the excitation space (resonating space) for preventing the same from being spattered. The energized gas is showered on the substrate from the resonating space. In order to establish an electron cyclotron resonance, the pressure in a resonating space is kept at $1 \times 10^{-3}$ to $1 \times 10^{-4}$ Torr at which electrons can be considered as independent particle and resonate with a microwave in an electron cyclotron resonance on a certain surface on which the magnetic field takes a particular strength required for ECR. The excited plasma is extrated from the resonating space, by means of a divergent magnetic field, to a deposition space which is located distant from the resonating space and in which is disposed a substrate to be coated.

In such a prior art method, it is very difficult to form a thin film of a polycrystalline or single-crystalline structure, so that currently available methods are almost limited to processes for manufacturing amorphous films. Also, high energy chemical vapor reaction is difficult to take place in accordance with such a prior art and therefore a diamond film or other films having high melting points, or uniform films on an even surface having depressions and caves can not be formed.

Furthermore, it was impossible to coat the surface of a super hard metal such as tungsten carbide with a carbon film. Because of ,this, it is required to coat a super hard surface with a fine powder of diamond for use of abrasive which has a sufficient hardness and to make sturdy mechanical contact between the diamond powder and the substrate surface.

SUMMARY OF THE INVENTION

It is therefore an object of the invention to provide a new structure of carbon substance which has a high hardness and a surface smoothness.

According to one aspect of the invention, in addition to a carbon compound, nitrogen and/or a nitrogen compound gas is inputted to the reaction chamber. The inputted nitrogen functions to prevent lattice defects from growing by virtue of external or internal stress. When a boron compound is also inputted together with the nitrogen compound, the adhesivity of carbon deposited is improved. Boron nitride appears to be the binder between the carbon and the underlying substrate to be coated such as made of super hard metal, for example tungsten carbide. Preferably, carbon and boron nitride are deposited on the substrate in the form of crystalline grain particles or a layer containing nitrogen and boron at less than 10%.

According to another aspect of the invention, a new CVD process has been culminated. The new process utilizes a mixed cyclotron resonance which was introduced firstly by the inventors. In the new type of exciting process, a sonic action of reactive gas itself must be taken into consideration as a non-negligible perturbation besides the interaction between respective particles of the reactive gas and magnetic field and microwave, and therefore charged particles of a reactive gas can be absorbed in a relatively wide resonating space. Preferably, the pressure is maintained higher than 3 Torr. For the mixed resonance, the pressure in a reaction chamber is elevated $10^2$–$10^5$ times as high as that of prior art. For example, the mixed renonance can be established by increasing the pressure after ECR takes place at a low pressure. Namely, first a plasma gas is placed in ECR condition at $1 \times 10^{-3}$ to $1 \times 10^{-5}$ Torr by inputting microwave under the existence of magnetic field. Then a reactive gas is inputted into the plasma gas so that the pressure is elevated to 0.1 to 300 Torr and the resonance is changed from ECR to MCR (Mixed Cyclotron Resonance). Carbon can be decomposed and undergo a necessary reaction at only such a comparatively high pressure. In process, diamond is likely to grow selectively on convexies.

Although carbon is deposited also in an amorphous phase when diamond is prefered, hydrogen in a plasma state eliminates preferentially amorphous carbon by etching, remaining crystalline carbon.

It has been found that the hardness of the diamond formed by the present invention is 1.3 to 3.0 times as high as that of diamond which has been made by prior art vapor phase method.

BRIEF DESCRIPTION OF THE DRAWINGS

FIGS. 6(A) and 6(B) are graphical diagrams showing the growth rate versus the reaction pressure.

FIG. 6(C) is graphical diagram showing how the growth rate is dependent on additional $H_2$, the substrate temperature, or the flow rate of a hydrocarbon.

DETAILED DESCRIPTION OF THE PREFERRED EMBODIMENTS

Figure 1:
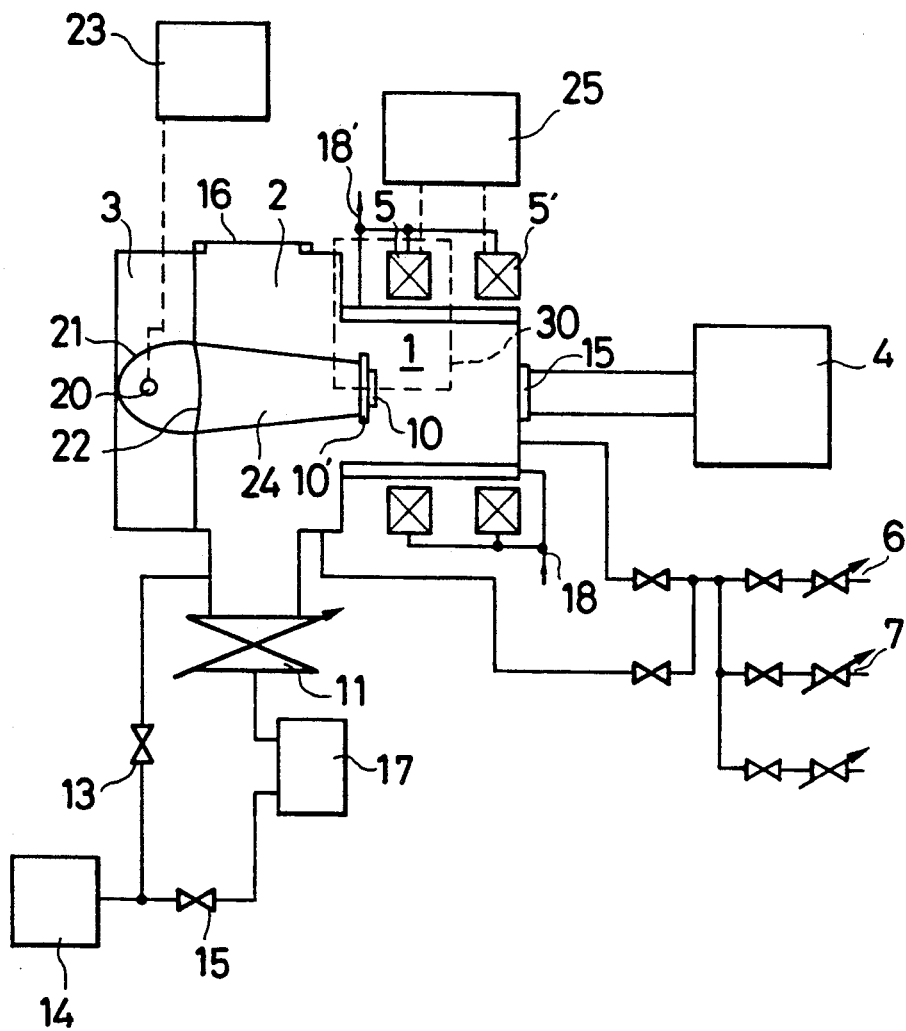
FIG. 1 is a cross section view showing a CVD apparatus in accordance with the present invention.

Referring to FIG. 1, a microwave enhanced plasma CVD apparatus for depositing carbon substance in accordance with the present invention is illustrated. In the figure, the apparatus comprises a reaction chamber in which a plasma generating space 1 and an auxiliary space 2 are defined and can be maintained at an appropriate negative pressure, a microwave genarator 4, electro-magnets 5 and 5' in the form of helmholtz coils surrounding the space 1, a power supply 25 for supplying an elecric power to the electro-magnets 5 and 5', and a water cooling system 18. The plasma generating space 1 has a circular cross section. In the plasma generating space 1, a substrate holder 10' made of a material which less disturbs the condition of magnetic field created by the magnets 5 and 5' in the chamber, e.g., made of stainless steel or quartz is provided on which a substrate 10 is mounted. The substrate holder 10' is irradiated and heated to 800–1000° C. in the atmosphere of a high temperature plasma gas with an infrared light 24, which is emitted from an IR heater 20, reflected from an IR reflection parabola mirror 21 and focused on the back surface of the holder 10' through a lens 22. A reference numeral 23 designates a power supply for the IR heater 20. Provided for evacuating the reaction chamber is an evacuating system comprising a turbo molecular pump 17 and a rotary pump 14 which are connected with the reaction chamber through pressure controlling valves 11, 13 and 15. The substrate temperature may reach to a sufficient level only in virtue of the plasma gas generated in the reaction chamber. In that case, the heater can be dispensed with. Further, depending on the condition of the plasma, the substrate temperature might elevate too high to undergo a suitable reaction. In that case, cooling means has to be provided. The process with this apparatus is carried out as follows.

A substrate 10 is mounted on the substrate holder 10', and the reaction chamber is evacuated to $1 \times 10^{-6}$ Torr or a higher vacuum condition. Then, hydrogen gas is introduced from a gas introducing system 6 at 30 SCCM, and a microwave of 500 Watt at 2.45GHz is emitted from the microwave generator 4 through a microwave introduction window 15 to the plasma generating space 1 which is subjected to an magnetic field of about 2 K Gauss induced by the magnets 5 and 5'. The hydrogen is excited into a high density plasma state in the space 1 at $1 \times 10^{-4}$ Torr by the energy of the microwave. The surface of the substrate is cleaned by high energy elecrons and hydrogen atoms. In addition to the introduction of the hydrogen gas, a cabon compound gas as the productive gas such as $C_2H_2$, $C_2H_4$, $CH_3OH$, or $CH_4$ are inputted at 30 SCCM through an introduction system 7. In this process, the productive gas is diluted with hydrogen at a sufficiently thin density, e.g., 0.1 to 5%. Further in addition to this, a nitrogen or its compound gas, such as ammonia or nitrogen gas, is inputted to the reation chamber from the introduction system. The proportion of the nitrogen compound gas to the carbon compound gas is 0.1%–5%. Then, the pressure in the reaction chamber is maintained at 0.1 Torr–300 Torr, preferably 3–30 Torr, e.g., 1 Torr. By increasing this pressure in the reaction chamber, it is possible to make high the density of the productive gas and, therefore, faster the growth rate of the product. Namely, carbon atoms are excited in a high energy condition so that the substrate 10 mounted on the holder 10' is coated with carbon in the form of a film made of i-carbon (insulated carbon consisting of microcrystals) or diamond having 0.1 to 100 microns in grain diameter. The deposited carbon contains nitrogen at 0.01-1 weight %. It is also effective to add boron to the deposited carbon film at 0.001-1 weight % by inputting boron compound gas together with the above mentioned process gas.

Experimental polishing using adrasives coated with a diamond including nitrogen in accordance with the present invention and a prior art diamond devoid of nitrogen has been made for the purpose of comparison. As a result, the degradation of the former in polishing power was half or less of the latter. Namely, the diamond according to the invention has a high resistance to wear.

Next, another embodiment is described. A substrate 10 is mounted on the substrate holder 10', and the reaction chamber is evacuated to $1 \times 10^{-6}$ Torr or a higher vacuum condition. Then, hydrogen gas is introduced from a gas introducing system 6 at 300 SCCM, and a microwave of 1 Kilo Watt at 2.45GHz is emitted from the microwave generator 4 through a microwave introduction window 15 to the plasma generating space 1 which is subjected to an magnetic field of about 2 K Gauss induced by the magnets 5 and 5'. The hydrogen is excited into a high density plasma state in the space 1 by the energy of the microwave. The surface of the substrate is cleaned by high energy elecrons and hydrogen atoms. In addition to the introduction of the hydrogen gas, a carbon compound gas as the productive gas such as $C_2H_2$, $C_2H_4$, $Ch_3OH$, $C_2H_5OH$ or $CH_4$ are inputted at 3 SCCM through an introduction system 7. In this process, the productive gas is diluted with hydrogen at a sufficiently thin density, e.g., 0.1 to 15%. Further in addition to this, a nitrogen compound gas such as ammonia, $NO_2$, $NO$, $N_2$ or nitrogen gas, and $B_2H_6$ or $BF_3$ are inputted to the reation chamber from the introduction systems 7 and 8 respectively at B/N=1. The proportion of $B_2H_6(BF_3)+NH_3$ to the carbon compound gas is 1%–50%. Then, the pressure in the reaction chamber is maintained at 1 Torr–760 Torr, preferably higher than 10 Torr or 10–100 Torr, e.g., 30 Torr. By increasing this pressure in the reaction chamber, it is possible to make high the density of the productive gas and, therefore, faster the growth rate of the product. Namely, the substrate 10 mounted on the holder 10'is coated with carbon containing nitrogen and boron (or in the form of boron nitride). The product includes carbon and boron nitride as the main components, the sum of whose proportions is at least 90%.

Figure 2A:
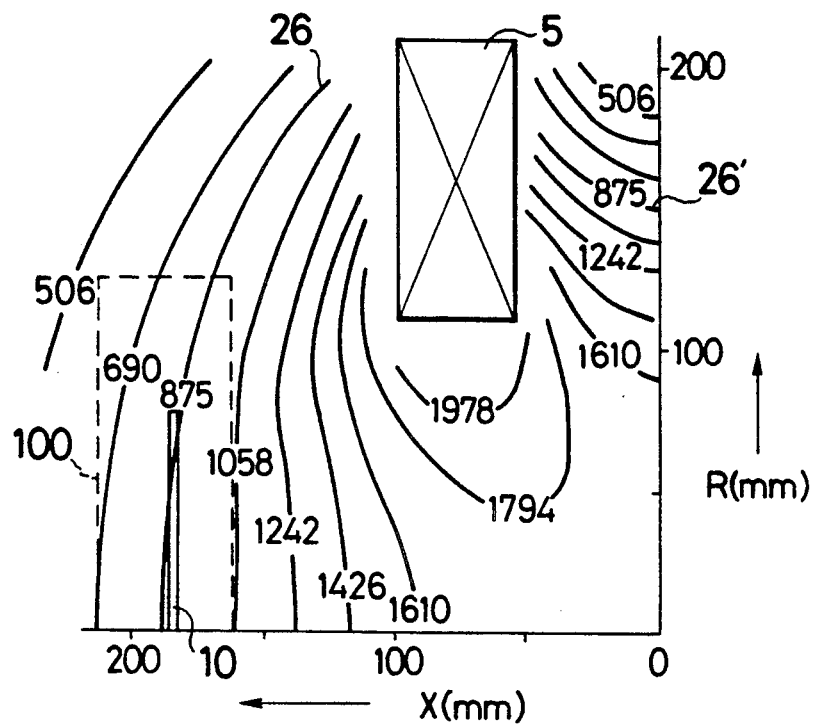
FIG. 2(A) is a graphical diagram showing the profile of the equipotential surfaces of magnetic field in cross section in accordance with a computor simulation.
Figure 2B:
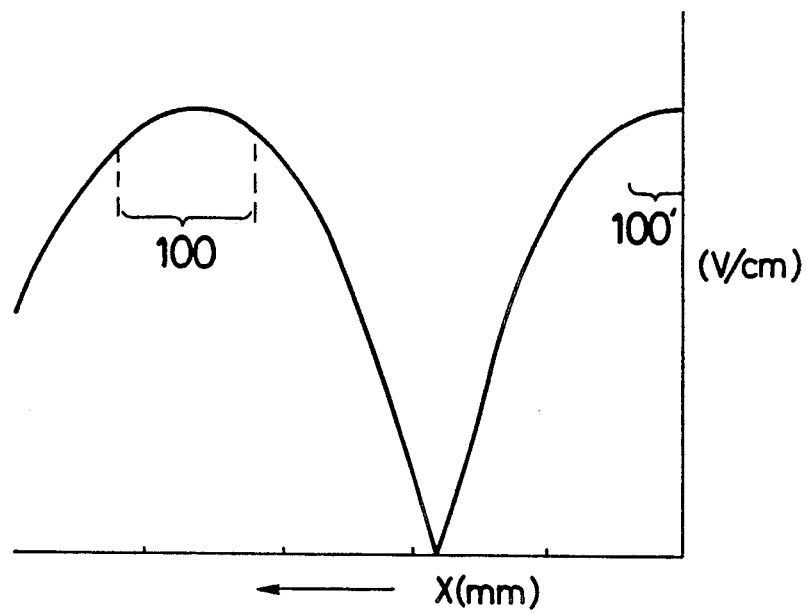
FIG. 2(B) is a graphical diagram showing the strength of electric field in accordance with a computor simulation.
Figure 3A:
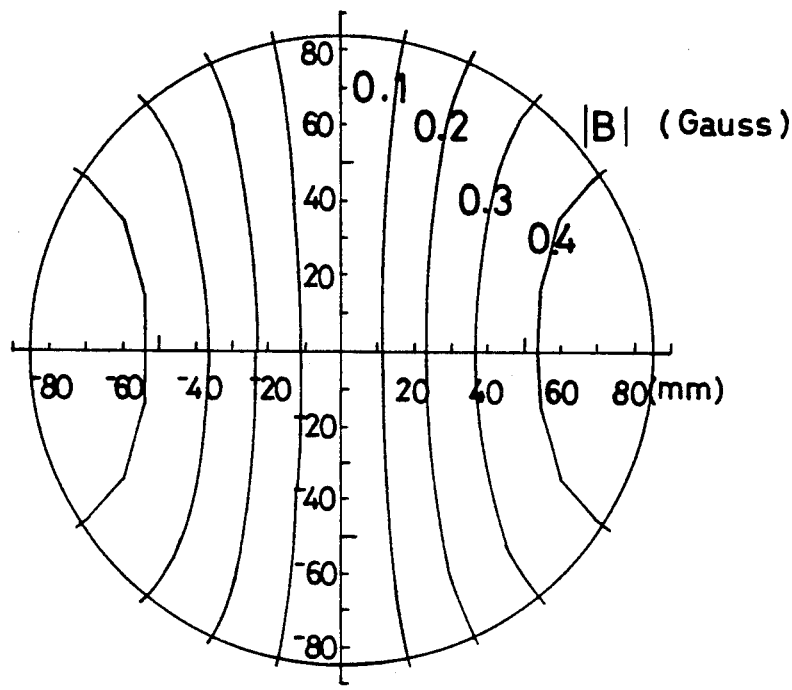
FIGS. 3(A) and 3(B) are graphical diagrams showing equipotential surfaces in terms of magnetic field and electric field of microwave propagating in a resonating space. respectively.
Figure 3B:
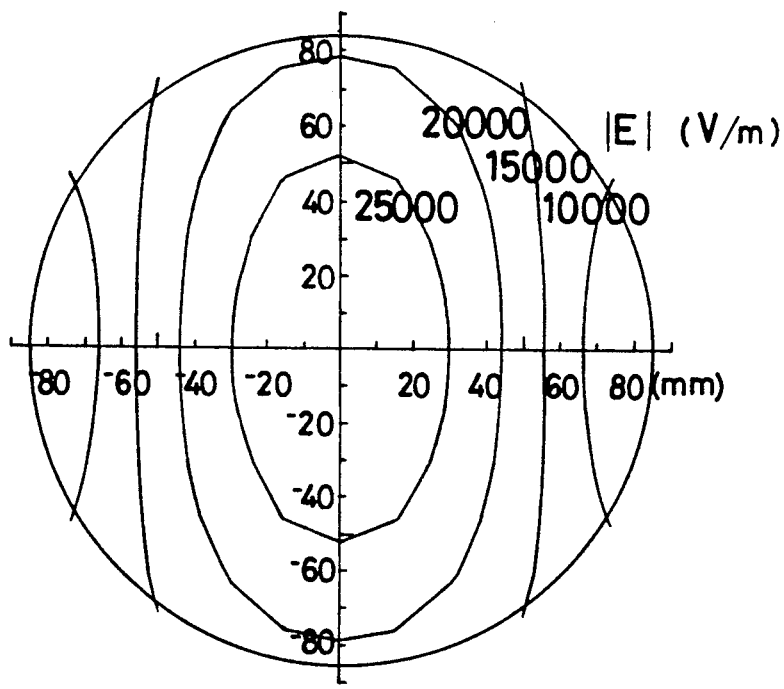

FIG. 2(A) is a graphical diagram showing the distribution of magnetic field on the region 30 in FIG. 1. Curves on the diagram are plotted along equipotential surfaces and given numerals indicating the strengths on the respective curves of the magnetic field induced by the magnets 5 and 5' having a power of 2000 Gauss. By adjusting the power of the magnets 5 and 5', the strength of the magnetic field can be controlled so that the magnetic field becomes largely uniform over the surface to be coated which is located in the region 100 where the magnetic field (875±185 Gauss) and the electric field interact. In the diagram, a reference 26 designates the equipotential surface of 875 Gauss at which ECR (electron cyclotron resonance) condition between the magnetic field and the frequency of the microwave is satisfied. Of course, in accordance with the present invention, ECR can not be established due to the high pressure in the reaction chamber, but instead a mixed cyclotron resonance (MCR) takes place in a broad region including the equipotential surface of the ECR condition. FIG. 2(B) is a graphical diagram of which the X-axis corresponds to that of FIG. 2(A) and shows the strength of electric field of the microwave in the plasma generating space 1. The strength of the electric field takes its maximum value in the regions 100 and 100'. However, in the region 100', it is difficult to heat the substrate 10' without disturbing the propagation of the microwave. In other region. a film is not uniformly deposited, but deposited the product in the form of a doughnut. It is for this reason that the substrate 10 is disposed in the region 100. The plasma flows in the lateral direction. According to the experimental, a uniform film can be formed on a circular substrate having a diameter of up to 100 mm. Preferably, a film is formed in the chamber on a circular substrate having a diameter of up to 50 mm with a uniform thickness and a uniform quality. When a larger substrate is desired to be coated, the diameter of the space 1 can be sized double with respect to the vertical direction of FIG. 2(A) by making use of 1.225 GHz as the frequency of the microwave. FIGS. 3(A) and 3(B) are graphical diagrams showing the distributions of the magnetic field and the electric field due to microwave emitted from the microwave generator 4 on a cross section of the plasma generating space 1. The curves in the circles of the figures are plotted along equipotential surfaces and given numerals showing the strength. As shown in FIG. 3(B), the electric field reaches its maximum value at 25 KV/m.

On the electron beam reflaction image of the thin film produced in accordance with the above procedure, observed are spots indicating the presence of polycrystalline boron nitride and crystal carbon, i.e., diamond (single-crystalline particles). Namely, the film is made of the mixture of boron nitride and diamond. As the microwave power is increased from 1KW to 5KW, the proportion of diamond in the film increases.

When $BF_3$ and/or $NF_3$ is used as the boron and/or nitrogen source, the plasma gas becomes containing fluorine and which fluorine functions to eliminate impurity residing on the surface to be coated by etching.

For reference, a film formation process was performed in the same manner as in the above but without using a magnetic field. As a result, a graphite film was deposited.

By a similar process, amorphous or microcrystalline film can also be deposited by appropriately selecting the deposition condition. An amorphous film is deposited when carbon compound gas is diluted with the larger amount of hydrogen gas, when the input power is comparatively small and when the process temperature is comparatively low. When DC bias current is superimposed on the alternating current in the deposition condition suitable for amorphous, the deposited film becomes including microcrystalline structure.

It is a significant feature of the invention that the carbon formed in accordance with the invention has a very high hardness irrespective of whether the carbon is amorphous or crystalline. The Vickers hardness is 4500–6400 $Kg/mm^2$, e.g., 2000 $Kg/mm^2$. The thermal conductivity is not lower than 2. 5 W/cm deg, e.g. 5.0–6.6 W/cm deg.

Figure 4:
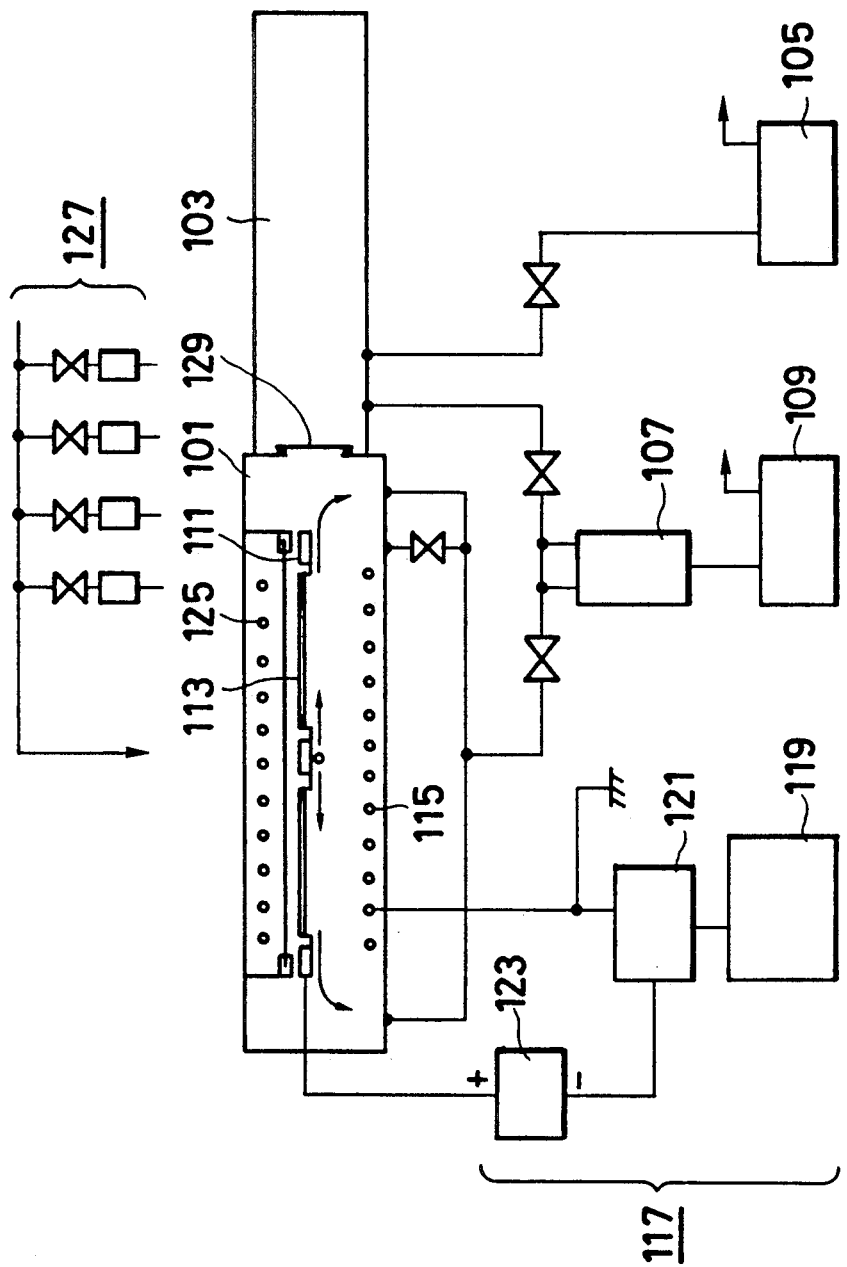
FIG. 4 is a cross sectional view showing another CVD apparatus for depositing a carbon film in accordance with the present invention by virtue of a R.F. power.

The present invention can be applied for the formation of carbon by means of glow or arc discharge enhanced CVD caused by an r.f. power. FIG. 4 is a cross sectional view showing a CVD apparatus for deposition by virtue of an r.f. power. In the figure, the apparatus comprises a reaction chamber 101, a loading chamber 103, a rotary pump 105 for evacuating the loading chamber 103, a turbo molecular pump 107 associated with a rotary pump 109 for evacuating both the reaction chamber 101 and the loading chamber 103, a gas feeding system 127 for inputting process gas such as reactive gas or dopant gas through a nozzle 129, a substrate holder 111 for supporting substrates 113, electrodes 115 disposed opposite to the holder 111, an RF power supply 117 consisting of a radiofrequency power source 119 associated with a matching circuit 121 and a DC bias circuit 123 for supply an r.f. power between the electrodes 115 and the substrate holder 111, and a halogen lamp heater 125 with a quartz window 129 for heating the substrates 113. The deposition process for coating the substrates 113 with a carbon film is as follow.

After disposing the substrates 113 in the reaction chamber 101 through a gate 129, a reactive gas composed of a gaseous carbon compound such as $CH_4$, $C_2H_4$ and $C_2H_2$, and a dopant gas such as nitrogen, a nitrogen compound gas and a boron compound gas if necessary were inputted to the reaction chamber at $1\times10^{-3}$ to $5\times10^{-1}$ Torr. The carbon compound gas was diluted with hydrogen at 50 mol%. At the same time, the substrates 113 were heated to not higher than 450° C. by means of the heater 125. In this condition, a vapor reaction was initiated by means of r.f. power inputted from the power supply 117. The r.f. power was 50 W to 1 KW (0.03 to 3.00 $W/cm^2$) at 13.56MHz superimposed on an DC bias voltage of $-200V$ to $+400V$. Then, carbon films were deposited on the substrates 113 at a growth rate of 150 Å/min. The carbon film looked like an amorphous structure rather than a cystalline structure. Despite the amorphous structure, the hardness was measured as high as that of a diamond film. The Vickers hardness thereof was 4500–6400 $Kg/mm^2$, e.g., 2000 $Kg/mm^2$. So we call it "diamond-like carbon" or DLC for short. When the carbon was deposited without nitrogen and boron compounds, the characteristics remained as good as compared to that obtained with the dopant gas. Our experimental using Auger analysis has proved the existence of carbon bonds, in DLC, associated with the orbital $sp^3$ which generally features the diamond structure and has a bond angle of 108° while the bond angle of the $sp^2$ is 120°.

Figure 5:
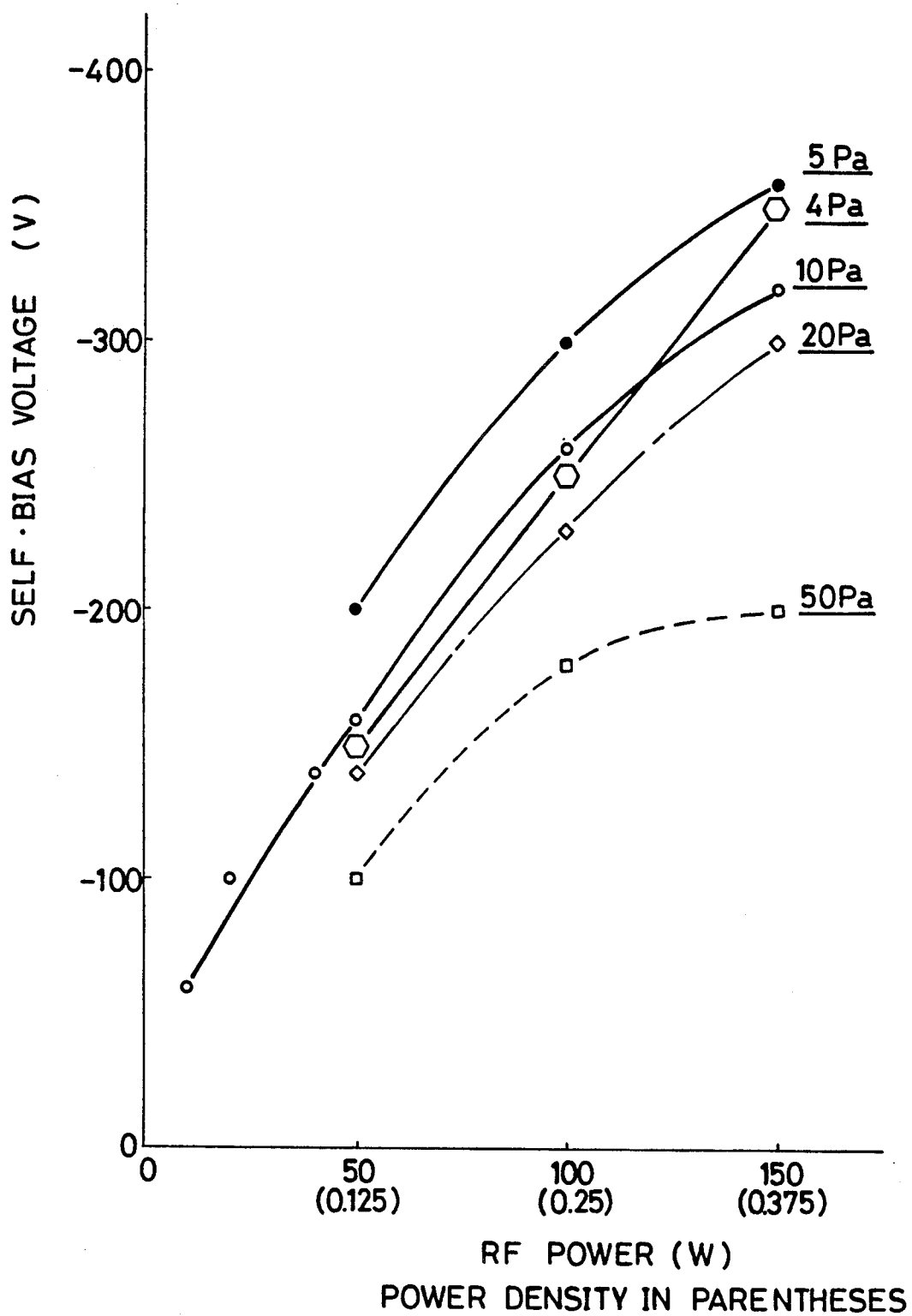
FIG. 5 is a graphical diagram showing the relationship among the reaction pressure, the RF power and self bias voltage which appears between the substrate to be coated and the opposed electrode when no external bias voltage is applied.
Figure 6B:
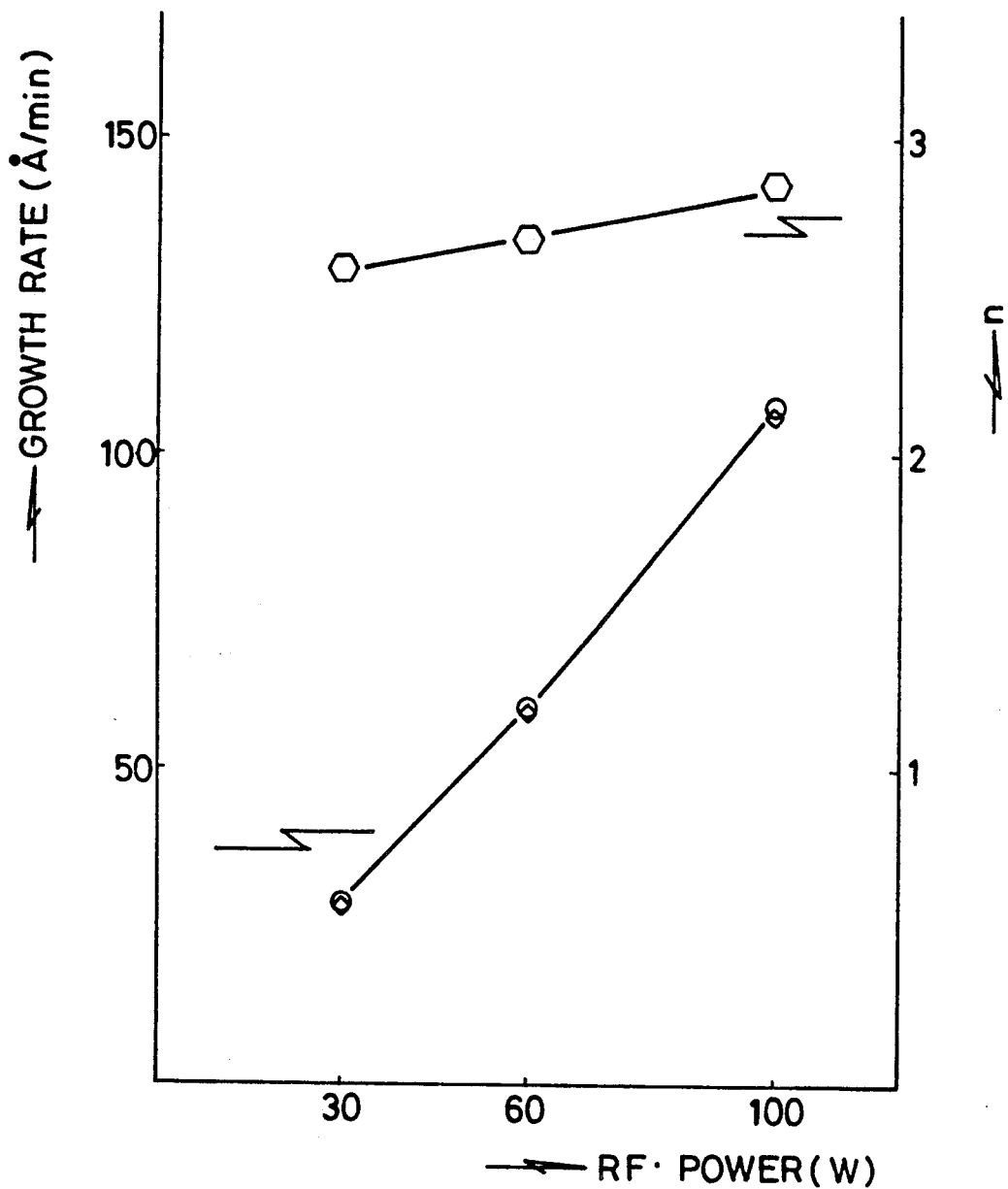
Figure 7:
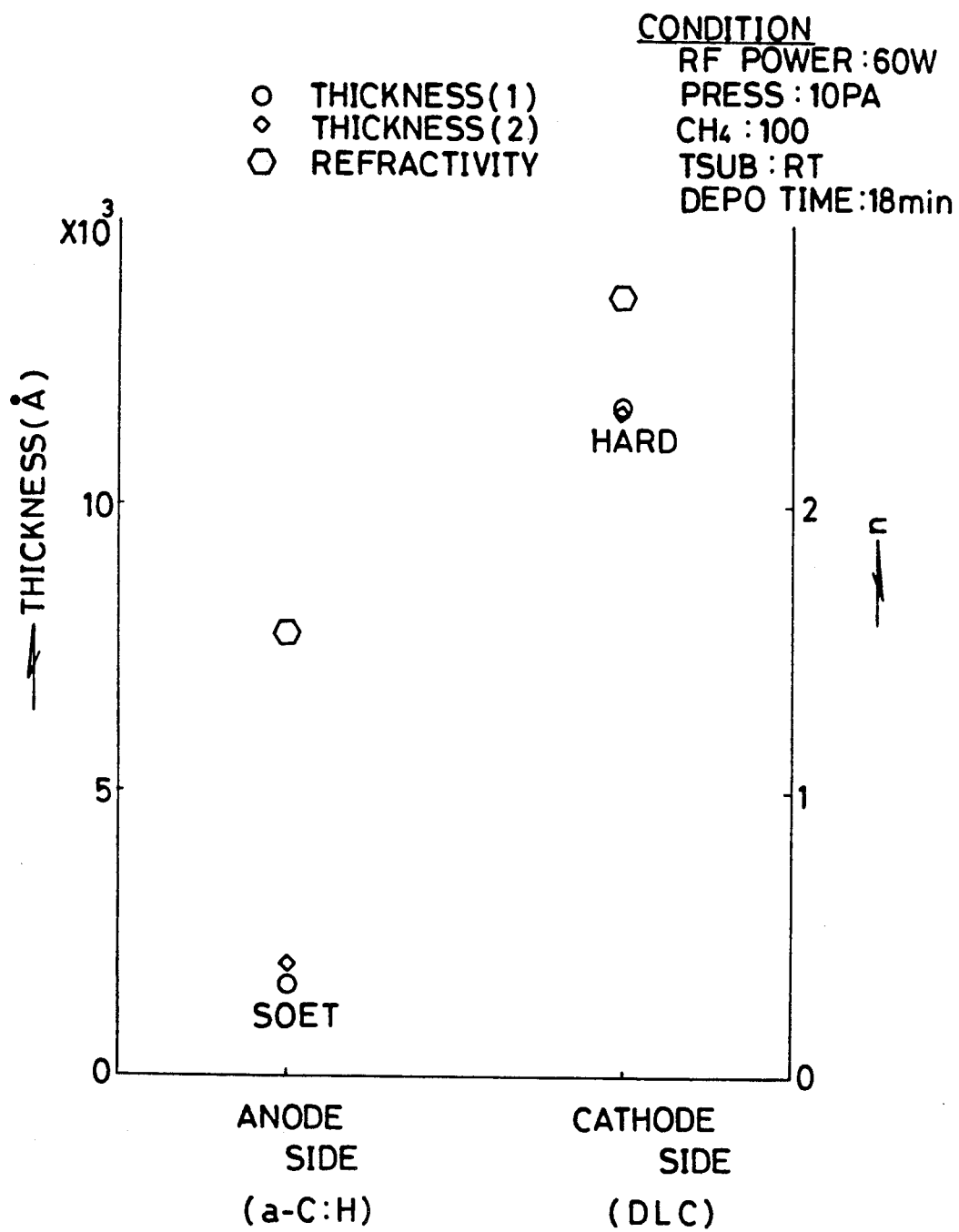
FIG. 7 is a diagram showing the differences between the carbon film deposited on a substrate as the anode and the carbon film deposited on a substrate as the cathode, wherein the thickness (1) was obtained by measuring the step formed on the edge of the film and the thickness (2) was measured by an elipsometer.

An accompanied table shows the physical properties of diamond, polycrystalline carbon or DLC, and crystalline silicon. FIG. 5 is a graphical diagram showing the relationship among the reaction pressure, the RF power and the self bias voltage which appears between the substrate to be coated and the opposed electrode when no external bias voltage is applied. FIG. 6(A) and 6(B) are graphical diagrams showing the growth rate versus the reaction pressure when a carbon film is deposited by RF power. FIG. 6(C) is graphical diagram showing how the growth rate is dependent on additional $H_2$, the substrate temperature, or the flow rate of a hydrocarbon. The same symbols are shared by FIGS. 5 and 6(A) to 6(C). FIG. 7 is a diagram showing the differences in phisical properties between the carbon film deposited on a substrate as the anode and the carbon film deposited on a substrate as the cathode, wherein the thickness (1) was obtained by measuring the step formed on the edge of the film and the thickness (2) was measured by an elipsometer.

In accordance with the present invention, a super lattice structure can be also formed. A boron nitride (BN) thin film is deposited in the same way as illustrated in the above but without using carbon compound gas. A carbon thin film and a BN thin film are deposited in turn many times so that a super lattice structure is sttacked on a substrate.

The invention should not limited to the above particular embodiments and many modifications and variations may cause to those skilled in the art. For example, it has been proved effective to add aluminium or phosphorous into carbon at 0.001 to 1 weight%. Although the reactive gas is let flow from a side to the right, the system can be designed so that the gas flows from left to right, or upward or downward.

TABLE

| | Diamond | Polycrystal or DLC | C—Si |
|---|---|---|---|
| Density (g/cm$^3$) | 3.52 2.26$^G$ | >2.25 (3.4)(1.7~1.8) | 2.3289 |
| Vickers Hardness (kg/mm$^2$) | >10$^4$ 327$^G$ | 3000~9500 (10$^4$)(3000~5000) | |
| Thermal Conductivity | | | |
| (w/cm.deg) | 6.6 = 0.8$^G$ ⊥2.5$^G$ | 1.1 | 1.70 |
| (w/cm.k) | (22) | | (1.5) |
| Resistivity (Ω.cm) | 10$^{13}$~10$^{18}$ 0.2~4 × 10$^{-3}$ $^G$ | 10$^9$~10$^{14}$ (10$^{12}$)(10$^{11}$~10$^{12}$) | |
| Permittivity | 5.93 | ~5.7 (7.5)(3.5~4.3) | 11.9 |
| Energy Gap (eV) | 5.4 (room temperature) | 1.2~1.7 | 1.1 |
| electron movility (cm$^2$/V.s) | 1800 | | 1350 |
| hole movility (cm$^2$/V.s) | 1200 | | 480 |
| refractive Index | 2.4186 | 2.38 (2.4)(2.2~2.4) | ~3.8 |
| Lattice Constant (Å) | 3.56679 | 3.566~3.567 | 5.43070 |
| Photon Energy (meV) | 165 | | |
| Light Transmissivity | good | good | |

$^G$graphite

I claim:

1. A cyclotron resonance chemical vapor deposition method of forming an amorphous structure including carbon bonds associated with an SP$^3$ orbital on a substrate comprising:
    inputting at least one reactive gas into a reaction chamber;
    emitting a microwave into said reaction chamber;
    establishing a magnetic field in said reaction chamber where the direction of the magnetic field is substantially parallel to the direction of the microwave and the strength of the magnetic field is such as to cause cyclotron resonance in the reaction chamber;
    exhausting the reaction chamber to establish in the chamber a pressure range which is sufficiently high to prevent electron cyclotron resonance from occurring;
    holding the substrate approximately at a position where said cyclotron resonance occurs in the reaction chamber; and
    depositing said amorphous carbon on a surface of the substrate.

2. A method as in claim 1 where said cyclotron resonance is mixed cyclotron resonance.

3. The method of claim 1 wherein said alcohol is diluted with hydrogen at 0.01 to 15%.

4. The method of claim 1 wherein a gas comprising nitrogen is inputted into said reaction chamber together with said reactive gas.

5. A method as in claim 1 where said one reactive gas comprises a compound containing carbon, oxygen and hydrogen diluted with hydrogen.

6. A cyclotron resonance chemical vapor deposition method of forming a diamond or diamond-like carbon on a substrate comprising the steps of:
    inputting at least one reactive gas into a reaction chamber;
    emitting a microwave into said reaction chamber at a predetermined frequency and in a predetermined direction;
    establishing a stationary wave of said microwave in the reaction chamber;
    holding said substrate substantially at a position where said stationary wave attains a maximum value;
    establishing a magnetic field in said reaction chamber where the direction of the magnetic field in said reaction chamber is substantially parallel to the direction of the microwave and the strength of the magnetic field is such as to cause cyclotron resonance at approximately the position where the substrate is held in the reaction chamber;
    exhausting the reaction chamber to establish in the chamber a pressure range which is sufficiently high to prevent electron cyclotron resonance from occurring; and
    depositing said diamond or diamond-like carbon on a surface of the substrate.

7. A method as in claim 6 where said cyclotron resonance is mixed cyclotron resonance.

8. A method as in claim 6 where said one reactive gas comprises a compound containing carbon, oxygen and hydrogen diluted with hydrogen.

* * * * *